(12) United States Patent
Buch et al.

(10) Patent No.: US 7,076,512 B2
(45) Date of Patent: Jul. 11, 2006

(54) DIGITAL INTERPOLATION FILTER AND METHOD OF OPERATING THE DIGITAL INTERPOLATION FILTER

(75) Inventors: Steffen Buch, München (DE); Holger Gryska, München (DE)

(73) Assignee: Infineon Technologies AG, Munich (DE)

( * ) Notice: Subject to any disclaimer, the term of this patent is extended or adjusted under 35 U.S.C. 154(b) by 654 days.

(21) Appl. No.: 10/320,126

(22) Filed: Dec. 16, 2002

(65) Prior Publication Data

US 2003/0103560 A1 Jun. 5, 2003

Related U.S. Application Data

(63) Continuation of application No. PCT/DE01/01957, filed on May 21, 2001.

(30) Foreign Application Priority Data

Jun. 15, 2000 (DE) ................ 100 29 424

(51) Int. Cl.
*G06F 17/17* (2006.01)
(52) U.S. Cl. .................................. 708/313
(58) Field of Classification Search ................. 708/313
See application file for complete search history.

(56) References Cited

U.S. PATENT DOCUMENTS 5,079,734 A * 1/1992 Riley .................. 708/313
5,191,334 A 3/1993 Yasuda
5,590,065 A * 12/1996 Lin ..................... 708/313
5,835,390 A 11/1998 Trager

FOREIGN PATENT DOCUMENTS

| JP | 05-243906 | 9/1993 |
|----|-----------|--------|
| JP | 09-162699 | 6/1997 |

OTHER PUBLICATIONS

Saramäki, T. et al.: "VLSI-Realizable Multiplier-Free Interpolators for High-Order Sigma-Delta D/A Converters", IEEE, 1991, pp. 295-298.

Chu, S. et al.: "Multirate Filter Designs Using Comb Filters", IEEE Transactions on Circuits and Systems, vol. CAS-31, No. 11, Nov. 1984, pp. 405-416.

Hogenauer, E.: "An Economical Class of Digital Filters for Decimation and Interpolation", IEEE Transactions on Acoustics, Speech, and Signal Processing, vol. ASSP-29, No. 2, Apr. 1981, pp. 155-162.

* cited by examiner

*Primary Examiner*—Tan V. Mai
(74) *Attorney, Agent, or Firm*—Laurence A. Greenberg; Werner H. Stemer; Ralph E. Locher

(57) ABSTRACT

A digital comb filter contains filter stages. Each filter stage has a latch disposed at a filter stage input, which latch, by outputting each input data value twice in each case doubles the sampling rate. Each filter stage further has a filter structure, a partial transfer function $\overline{H}$ (z) of which is $\overline{H}(z)\alpha(1+z^{-1})^{k-1}$, where k is an order of the filter device and $z^{-1}$ is the z transform of a delay by one sampling pulse. The implementation according to the invention does not require an error correction circuit.

12 Claims, 3 Drawing Sheets

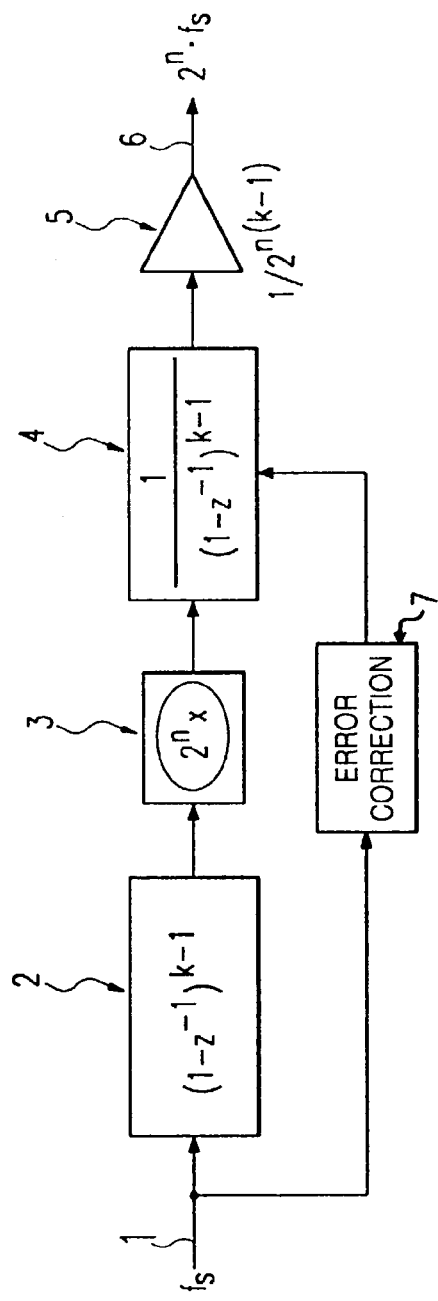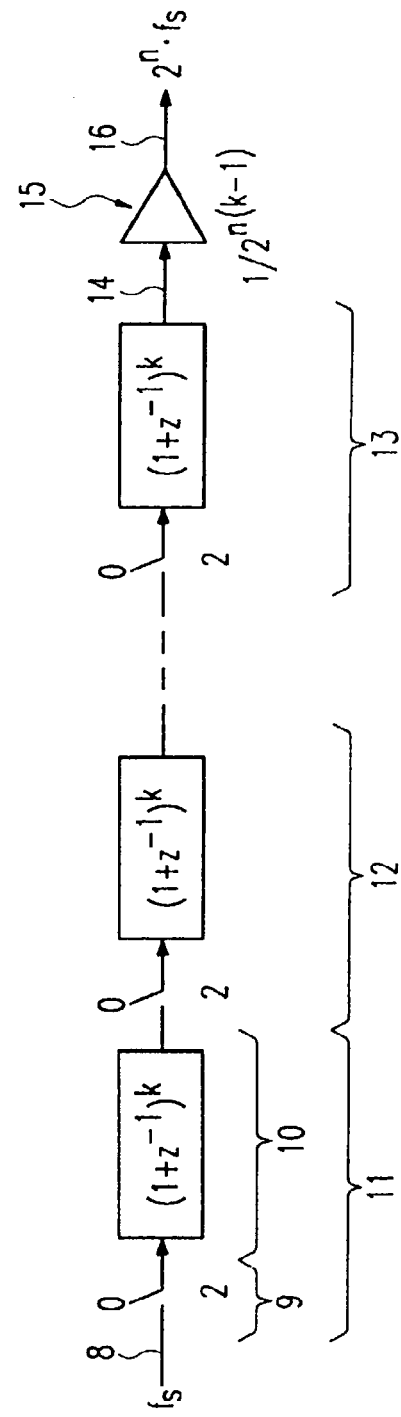
FIG. 1
PRIOR ART
FIG. 2

DIGITAL INTERPOLATION FILTER AND METHOD OF OPERATING THE DIGITAL INTERPOLATION FILTER

CROSS-REFERENCE TO RELATED APPLICATION

This application is a continuation of copending International Application No. PCT/DE01/01957, filed May 21, 2001, which designated the United States and was not published in English.

BACKGROUND OF THE INVENTION

Field of the Invention

The invention relates to a digital filter device and a filtering method for increasing the sampling rate and reconstructing signals of discrete-time input data. In particular, the invention relates to a novel implementation of a digital comb filter.

When a digital input signal is converted into an analog signal by a digital/analog converter, the quality of the signal obtained depends on the noise level of the digital input signal. To reduce the noise in the input signal, it is known to increase the signal rate of the digital input signal before it is converted into an analog signal and to shift the noise towards higher frequencies. Increasing the sampling rate and thus the cut-off frequency is done by inserting zeros between the data values and by digitally filtering the data sequence.

The signal rate is to be increased typically by a factor of 20–400. In a known multi-stage filter configuration, the signal rate is first increased by a factor of 4–16 by the alternating insertion of zeros. The spectrum thus obtained is then filtered by a digital low-pass filter. The signal rate of the signal thus produced is then increased to the final value by inserting the appropriate number of zeros between the individual data values. The signal thus obtained already exhibits the required signal rate but must finally be subjected to another digital signal reconstruction. The signal reconstruction is used for eliminating unwanted higher-frequency components in the spectrum and is performed by a digital comb filter.

The implementation of such a digital comb filter is the subject-matter of the present invention.

SUMMARY OF THE INVENTION

It is accordingly an object of the invention to provide a digital interpolation filter and a method of operating the digital interpolation filter that overcome the above-mentioned disadvantages of the prior art devices and methods of this general type, which increases the sampling rate and signal reconstruction and can be implemented with less circuit complexity and needs less chip area.

With the foregoing and other objects in view there is provided, in accordance with the invention, a digital filter device for increasing a sampling rate and reconstructing signals of discrete-time input data. The digital filter device contains n filter stages disposed in series and each having a filter stage input and a latch connected to the filter stage input, the latch doubling the sampling rate by outputting each input data value twice. Each of the n filter stages have a filter structure disposed downstream of the latch and have a partial transfer function $\overline{H}(z)$ defined by $$\overline{H}(z) \propto (1+z^{-1})^{k-1}.$$

A transfer function H(z) of the entire digital filter device being $$H(z) \propto \left(\frac{1-z^{-(2^n)}}{1-z^{-1}}\right)^k,$$

where k is an order of the digital filter device and $2^n$ is a factor of an increase in the sampling rate and $z^{-1}$ is a z transform of a delay by one sampling pulse.

The digital comb filter according to the invention is disposed in n filter stages. Each filter stage exhibits at its input a repetition element in the form of a latch that outputs each input data value twice and thus doubles the signal rate. The repetition element is followed by a filter structure, the partial transfer function $\overline{H}(z)$ of which is $$\overline{H}(z) \propto (1+z^{-1})^{k-1},$$

where k is the order of the filter device and $z^{-1}$ is the z transform of a delay by one sampling pulse.

Since the signal rate is doubled in each of the n filter stages, the digital filter device overall causes the signal rate to be increased by the factor $2^n$. The transfer function H(z) of the entire filter device containing n stages is $$H(z) \propto \left(\frac{1-z^{-(2^n)}}{1-z^{-1}}\right)^k,$$

and the transfer function corresponds exactly to the transfer function of known comb filter implementations.

Compared with the comb filters according to the prior art, however, the implementation according to the invention has the advantage that it uses no recursive or feed-back structures whatsoever. There is no feedback of the data values present at the output to the input values either at the repetition element or at the filter structure provided in each filter stage. This can be seen by the fact that the partial transfer function $\overline{H}(z)$ does not have any poles and, therefore, can be implemented as a pure feed-forward structure.

In contrast with the prior art, the transfer function of a comb filter can be achieved exclusively by using feed-forward structures in the filter device according to the invention. Recursive structures can be completely avoided and any bit errors occurring will rapidly disappear again because they are not fed back to the input values. The comb filter implementation according to the invention does not have any error memory and that is why no circuit for error correction is needed. For this reason, the circuit complexity and thus also the requirement for silicon area in constructing the comb filter according to the invention is less than in the known solutions of the prior art.

It is advantageous if, in the case of a second-order digital filter device (k=2), each filter structure contains an adder, the value of which at the output is formed by adding the data value currently present at the filter structure and the data value belonging to the preceding sampling pulse. This represents the simplest implementation of a filter structure with the partial transfer function $$\overline{H}(z) \propto (1+z^{-1}).$$

It is advantageous if, in the case of a third-order digital filter device (k=3), each filter structure contains an adder, the value of which at the output is formed by adding the following data values:

a) the data value currently present at the filter structure;

b) the data value multiplied by 2, which belongs to the preceding sampling pulse; and c) the data value belonging to the a further preceding sampling pulse which proceeds the preceding sampling pulse.

In this manner, a filter structure with the partial transfer function $$\overline{H}(z)=(1+z^{-1})^2$$

can be implemented in a simple and inexpensive manner.

In this configuration, it is particularly advantageous if the data value belonging to the preceding sampling pulse is multiplied by 2 by left-shifting the bit pattern of the data value.

If digital filters are to be implemented, the transfer function of which exhibits coefficients not equal to 1, elaborate multiplier circuits are required, as a rule. However, this does not apply if the corresponding coefficient is a power of 2 because, in this case, the multiplication can be implemented with little expenditure by a corresponding bit shift. The multiplication of a data value by 2 corresponds to shifting the bit pattern to the left by one position.

According to a further advantageous embodiment of the invention, the transfer function H(z) of the digital filter device is $$H(z) = \frac{1}{2^{nk}} \left( \frac{1 - z^{-(2^n)}}{1 - z^{-1}} \right)^k,$$

where k is the order of the filter device and $2^n$ is the factor of the increase in sampling rate, and where $z^{-1}$ is the z transform of a delay by one sampling pulse. Normalization by the factor $$\frac{1}{2^{nk}}$$

has the effect that, in spite of the increase in sampling rate, the power of the input signal is equal to the power of the output signal. Thus, the comb filter will not affect the power of the signal to be filtered.

According to a further advantageous embodiment of the invention, the transfer function H(z) is normalized by a suitable number of right shifts of the bit patterns of the data values. Right shifts are easy to implement in digital technology. Every right shift results in a multiplication of the result by $$\frac{1}{2}$$

so that, using right shifts, any desired normalization can be achieved by multiplication by powers of $$\frac{1}{2}.$$

It is advantageous if the databus at the input of the j-th filter stage (j=1, . . . ,n) has a width of at least WL+(j−1)·(k−1)

data lines, where k is the order of the filter device and WL is the word length at the input of the first filter stage of the digital filter device;

if the databus between the latch and the filter structure of the j-th filter stage has a width of at least WL+(j−1)·(k−1)

data lines; and if the databus at the output of the j-th filter stage has a width of at least WL+j·(k−1)

data lines.

The advantage of this solution is that the databuses only have the minimum required bus width and, therefore, the circuit complexity can be kept down. The databus at the input of the first filter stage has a width of WL bits. The latch only doubles the sampling rate but the data values themselves remain unchanged. This is why a width of WL data lines is sufficient even in the databus between the latch and the filter structure of the first filter stage. Following this, the data are processed by the filter structure of the first filter stage. The filter structure is characterized by the transfer function $$\overline{H}(z)=(1+z^{-1})^{k-1}$$

which is why there are carries in this case so that further (k−1) data lines become necessary. The databus at the output of the first filter stage must, therefore, have a width of at least WL+(k−1)

data lines.

The method according to the invention for increasing the sampling rate and reconstructing signals of discrete-time input data is characterized by the following two steps which are repeated n times: first, the sampling rate is doubled by outputting each input data value twice. Then the data values are digitally filtered by a filter structure, the partial transfer function $\overline{H}$ (z) of which is $$\overline{H}(z) \propto (1+z^{-1})^{k-1},$$

where $z^{-1}$ is the z transform of a delay by one sampling pulse and k is the order of the entire digital filter device.

Executing these two steps n times increases the signal rate by a factor of $2^n$ in total. The filter structure required for the step of digital filtering represents a pure feed-forward structure and only requires little circuit complexity.

Other features which are considered as characteristic for the invention are set forth in the appended claims.

Although the invention is illustrated and described herein as embodied in a digital interpolation filter and a method of operating the digital interpolation filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a digital comb filter corresponding to the prior art, in which recursive filter structures are used;

FIG. 2 is a block diagram of the digital comb filter according to the invention, containing n stages;

DESCRIPTION OF THE PREFERRED EMBODIMENTS

Figure 3:
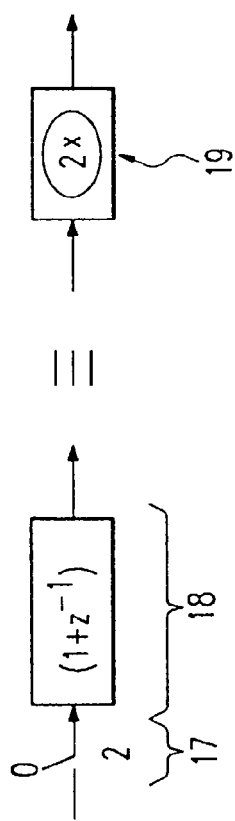
FIG. 3 is a block diagram of an equivalent circuit of a stage for zero insertion and a subsequent filter unit, on the one hand, and a repeater circuit, on the other hand.

Referring now to the figures of the drawing in detail and first, particularly, to FIG. 1 thereof, there is shown a digital comb filter for increasing a signal rate by powers of 2 and is characterized by the transfer function $$H(z) \propto \left( \frac{1 - z^{-(2^n)}}{1 - z^{-1}} \right)^k ,$$

FIG. 1 shows an implementation of such a comb filter according to the prior art. A digital input signal 1 having the signal rate $f_s$ is first filtered by a first filter stage 2 having the filter characteristic $$(1-z^{-1})^{k-1}$$

where $z^{-1}$ designates the z transform of a delay by one sampling pulse and k is the order of the comb filter. The digital data values at the output of the first filter stage 2 are supplied to a repetition stage 3 that repeats each input data value $(2^n-1)$ times so that each input data value appears $2^n$ times at the output of the repetition stage. The repetition stage 3, therefore, increases the signal rate to $(2^n \cdot f_s)$ in one step.

The result values of the repetition element 3 are supplied to a further digital filter stage 4 having the transfer function $$\frac{1}{(1 - z^{-1})^{k-1}}$$

It can already be seen from the transfer function that the filter stage 4 is a feed-backward structure, that is to say a filter structure with feedback, the results of which are fed back to its own input.

So that the power of the output signal 6 matches the power of the input signal 1, the signal is multiplied by the factor $$\frac{1}{2^{n(k-1)}}$$

by the attenuator 5.

Using feedback or recursive structures in a filter configuration has the disadvantage that bit errors produced, for example, by irradiation or by transmission errors, are fed back to the input values time and again and therefore corrupt a large number of data. A single error value remains stored in the system for a long time and thus results in the error being propagated to subsequent result values.

When using recursive digital filter structures, therefore, it is necessary to provide an error correction logic 7, also shown in FIG. 1, which initializes the registers of the recursive filter stage 4 at periodic intervals. It is only by this measure that the long-term stability of such a digital filter configuration can be guaranteed. The circuit complexity for implementing a suitable error correction circuit 7 is considerable. The error correction circuit requires approximately the same silicon area as the actual filter circuit itself.

FIG. 1 shows the circuit of a digital comb filter with the transfer function $$H(z) = \frac{1}{2^{nk}} \left( \frac{1 - z^{-(2^n)}}{1 - z^{-1}} \right)^k ,$$

By using the binomial formula $$(1-z^{-2m}) = (1+z^{-m}) \cdot (1-z^{-m})$$

the expression for the transfer function can be transformed into $$H(z) = \frac{1}{2^{nk}} \left( 1 + z^{-1} \right)^k \cdot \left( 1 + z^{-2} \right)^k \cdot \left( 1 + z^{-4} \right)^k \ldots \left( 1 + z^{-(2^{n-1})} \right)^k$$

$$= \frac{1}{2^{nk}} \prod_{m=0}^{n-1} \left( 1 + z^{-(2^m)} \right)^k .$$

Thus, the transfer function of the comb filter can also be represented in factorized notation.

In digital filter technology, the signal rate is increased by inserting a corresponding number of zeros between the individual data values. To increase the signal rate $f_s$ by the factor m to $(m \cdot f_s)$, $(m-1)$ zeros must be inserted in each case between two data values. In the text which follows, the notation $$\overset{0}{\underset{m}{\rangle}} (\ldots)$$

will be used for increasing the signal rate in this manner by the factor m by inserting $(m-1)$ zeros.

The signal rate is to be increased by the factor $2^n$ both in the comb filter implementation according to the prior art, shown in FIG. 1, and in the implementation according to the invention. The transformation of the input data affected by the comb filter can thus be represented as follows:

$$\underset{2^n}{\overset{0}{\rangle}} H(z) \equiv \underset{2^n}{\overset{0}{\rangle}} \frac{1}{2^{nk}} \cdot \left( \frac{1 - z^{-(2^n)}}{1 - z^{-1}} \right)^k.$$

In the text that follows, it will be shown how a more advantageous implementation of the digital comb filter can be obtained by suitable transformations of this expression. In particular, use is made of the characteristic known as polyphase dissection that, in the case of an increase in signal rate by the factor m can be described by the equivalence relation $$\underset{m}{\overset{0}{\rangle}} f(z^{-m \cdot q}) \equiv f(z^{-q}) \underset{m}{\overset{0}{\rangle}}$$

where m and q are natural numbers.

In digital filter technology, $z^{-q}$ is used for accessing the data value located upstream by q positions. To this extent, it is equivalent if the data value located upstream by q positions is used before inserting (m−1) zeros or if, on the other hand, the data value located upstream by (m·q) positions is used after the insertion of in each case (m−1) zeros because, in both cases, the same data value is accessed. In the case of doubling the frequency, that is to say when in each case one zero is inserted between the data values, the following is obtained as a special case $$\underset{2}{\overset{0}{\rangle}} f(z^{-(2^p)}) \equiv f(z^{-(2^{p-1})}) \underset{2}{\overset{0}{\rangle}},$$

where p is again a natural number.

Using this polyphase dissection, the expression for the digital comb filter in the factorized notation $$\underset{2^n}{\overset{0}{\rangle}} H(z) \equiv \underset{2^n}{\overset{0}{\rangle}} \frac{1}{2^{nk}} \cdot \left( \frac{1 - z^{-(2^n)}}{1 - z^{-1}} \right)^k \equiv \underset{2^n}{\overset{0}{\rangle}} \frac{1}{2^{nk}}$$

$$(1 + z^{-1})^k \cdot (1 + z^{-2})^k \cdot (1 + z^{-4})^k \ldots (1 + z^{-(2^{n-1})})^k$$

can be transformed as follows:

$$\underset{\underbrace{22 \ldots 2}_{n \text{ times}}}{\overset{00 \ldots 0}{\rangle \rangle \ldots \rangle}} (1 + z^{-1})^k \cdot (1 + z^{-2})^k \cdot \ldots \cdot (1 + z^{-(2^{n-1})})^k \equiv$$

$$\underset{\underbrace{22 \ldots 2}_{(n-1) \text{ times}}}{\overset{00 \ldots 0}{\rangle \rangle \ldots \rangle}} (1 + z^{-1})^k \cdot (1 + z^{-2})^k \cdot \ldots \cdot (1 + z^{-(2^{n-2})})^k \underset{2}{\overset{0}{\rangle}} (1 + z^{-1})^k \equiv$$

$$\underset{\underbrace{22 \ldots 2}_{(n-2) \text{ times}}}{\overset{00 \ldots 0}{\rangle \rangle \ldots \rangle}} (1 + z^{-1})^k \cdot \ldots \cdot (1 + z^{-(2^{n-3})})^k \underset{2}{\overset{0}{\rangle}} (1 + z^{-1})^k \underset{2}{\overset{0}{\rangle}} (1 + z^{-1})^k \equiv$$

$$\underset{2}{\overset{0}{\rangle}} (1 + z^{-1})^k \underset{2}{\overset{0}{\rangle}} (1 + z^{-1})^k \ldots \underset{2}{\overset{0}{\rangle}} (1 + z^{-1})^k.$$

The implementation according to the invention of this transformed comb filter characteristic is shown in FIG. 2. The comb filter contains n stages, the frequency first being doubled at the input of each stage by inserting in each case one zero between the data values. Following this, the signal with doubled frequency thus obtained is supplied to a filter unit having the filter characteristic $(1+z^{-1})^k$ and filtered.

At an input of a first filter stage 11, an input signal 8 with the frequency $f_s$ is present. In the first filter stage 11, the input signal 8 first passes through a stage of zero insertion 9 in which the frequency is doubled to $(2 \cdot f_s)$. The subsequent filter unit 10 filters the signal but leaves the signal rate unchanged. The signal present at the output of the first filter stage 11 is supplied to a second filter stage 12 that again doubles the frequency. After passing through an n-th filter stage 13, a signal 14 is obtained which already has the required signal rate $(2^n \cdot f_s)$ An attenuator 15 attenuates the signal 14 by the factor $$\frac{1}{2^{n(k-1)}}.$$

At the output of the attenuator 15, the desired comb-filtered output signal 16 is then present, the power of which matches the power of the input signal 8.

In the normalization by the attenuator 15, it is not the factor $$\frac{1}{2^{nk}},$$

which is actually to be expected, but the factor $$\frac{1}{2^{n(k-1)}}$$

that is used. The reason for this is that with each stage of zero insertion, the power drops by one half so that the n-stage filter already attenuates the signal by the factor $$\frac{1}{2^n}.$$

For this reason, an attenuation by the factor $$\frac{1}{2^{n(k-1)}}$$

by the attenuator 15 is sufficient for achieving a correct normalization of the filter signal overall.

The attenuation is produced by subjecting the bit patterns of the individual data values to (n·k−n) right shifts because each right shift causes an attenuation of the signal by the factor $$\frac{1}{2}.$$

Each stage of the filter device according to the invention uses feed-forward structures. Any bit errors occurring, therefore, do not influence the subsequent results and the errors rapidly disappear again. An elaborate error correction circuit as needed in the prior art can be completely avoided with this implementation of a comb filter.

FIG. 3 shows on the left-hand side a filter configuration that contains one stage of zero insertion 17 and of a subsequent filter unit 18. In the text which follows, it will be assumed that the data sequence . . . , c, b, a is present at the input of the stage 17. The stage of zero insertion 17 in each case inserts a zero between two data values so that the data sequence . . . , 0, c, 0, b, 0, a, 0 appears at the output of stage 17. This data sequence is present at the input of the digital filter unit 18, the transfer function of which is given by $(1+z^{-1})$. The filter unit 18 in each case adds the preceding data value to the data value currently present at its input. Since the data sequence . . . , 0, c, 0, b, 0, a, 0 is present at the input of the filter unit 18, the data sequence . . . , c, c, b, b, a, a appears at the output of the filter stage 18.

In summary, the filter configuration shown on the left-hand side of FIG. 3 is equivalent to a repetition stage 19 shown on the right-hand side of FIG. 3, which outputs every value present at the input twice. Such a repetition stage 19 can be implemented by a latch that latches the input value until a new input value occurs. The output of the latch is then sampled at a signal rate that is doubled compared with the input data rate.

The implementation of the comb filter shown in FIG. 2 can be simplified further by this equivalence relation. Each of the n filter stages in FIG. 2 in each case contains the filter unit 10 which is characterized by the transfer function $(1+z^{-1})^k$. Each of the filter units 10 can be split into two serially disposed filter units; into a first filter unit having a transfer function $(1+z^{-1})$ and into a second filter unit with the transfer function $\overline{H}(z)=(1+z^{-1})^{k-1}$. Following this, the respective stage of zero insertion 9 and the first filter unit according to FIG. 3 can be combined to form one repetition stage.

Figure 4:
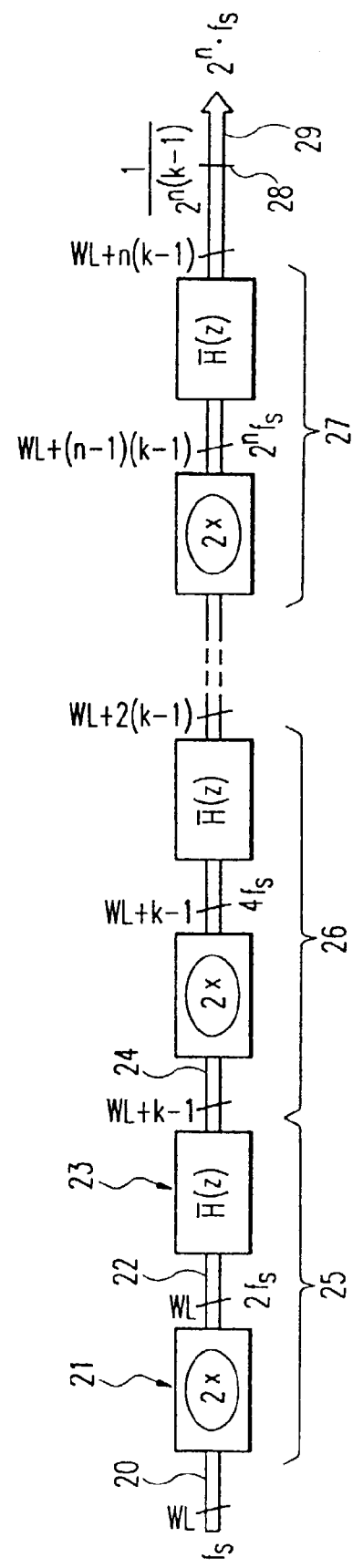
FIG. 4 is a block diagram of an advantageous circuit implementation of the digital comb filter according to the invention.

The result can be seen in FIG. 4. The complete filter device again contains n filter stages, each filter stage exhibiting a repetition stage disposed at the input followed by a filter structure. The filter characteristic of the filter structure is $\overline{H}(z)=(1+z^{-1})^{k-1}$. The output of the filter structure is then used as the input to the next filter stage following.

In the configuration shown in FIG. 4, a digital, WL-bit-wide signal of signal rate $f_s$ is present at an input 20 of the first filter stage 25. The signal is supplied to the latch 21 belonging to the first filter stage 25. The latch 21 is sampled at twice the signal rate $(2 \cdot f_s)$. On the databus 22 that connects the latch 21 to the filter structure 23, therefore, each data value present at the input 20 appears twice. Since these are again the data values present at the input, a width of WL bits is sufficient for the databus 22. The subsequent filter structure 23 digitally filters the data present at the databus 22 with the transfer function $\overline{H}(z)=(1+z^{-1})^{k-1}$, where $z^{-1}$ is the z transform of a delay by one sampling pulse and k is the order of the complete comb filter.

In the digital filtering, the data value currently present and the preceding data value are added; the result of the addition to the (k−1)-th power is then present at the output 24 of the first filter stage 25. It is important that carries can occur here so that (k−1) additional data lines become necessary. The width of a databus 24 which connects the first filter stage 25 to the second filter stage 26 is, therefore, WL+(k−1) bits.

In the second filter stage 26, the frequency is again doubled and, in addition, (k−1) more data lines become necessary at the output of the second filter stage 26. At the output of the n-th filter stage 27, a signal with a bit width WL+n·(k−1) and the signal rate $(2^n \cdot f_s)$ is then present. This signal is multiplied by the factor $$\frac{1}{2^{n \cdot (k-1)}}$$

by an attenuator 28.

This is done by n·(k−1) right shifts of the bit patterns of the data values.

The transfer function H(z) of the entire filter device represented in FIG. 4 is $$H(z) = \frac{1}{2^{nk}} \left( \frac{1 - z^{-(2^n)}}{1 - z^{-1}} \right)^k,$$

and, to this extent, the filter device according to the invention exhibits the same comb filter characteristics as the solution according to the prior art represented in FIG. 1.

For the required width of the data buses in the comb filter implementation according to the invention it generally holds true that the databus at the input of the j-th filter stage (where j=1, . . . ,n) must have a width of at least WL+(j−1)·(k−1)

data lines, that the databus between the latch and the filter structure of the j-th filter stage must have a width of at least WL+(j−1)·(k−1)

data lines and that the databus at the output of the j-th filter stage must have a width of at least WL+j·(k−1)

data lines.

Figure 5:
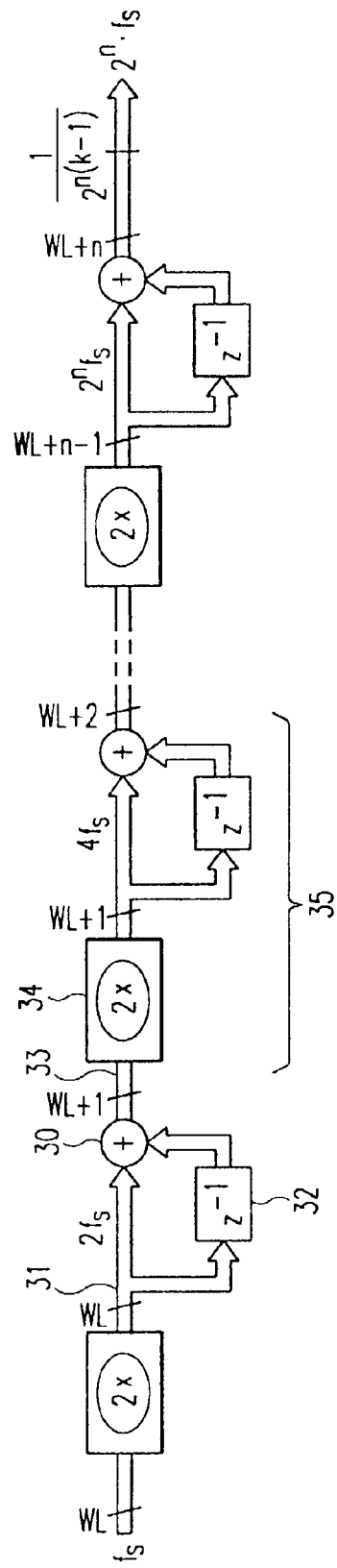
FIG. 5 is a block diagram of the implementation of a digital comb filter of the order k=2 according to the invention.

FIG. 5 shows an actual implementation of the comb filter according to the invention for the case of a second-order filter. In this case, k=2 and, therefore, the transfer function of the filter structure belonging to each filter stage is $\overline{H}(z)=(1+z^{-1})$.

The filter structure is implemented by an adder 30 that is supplied with a current data value 31, on the one hand, and, on the other hand, with a preceding data value 32. A result 33 of the addition is supplied to a repeater 34 of a next filter stage 35.

Figure 6:
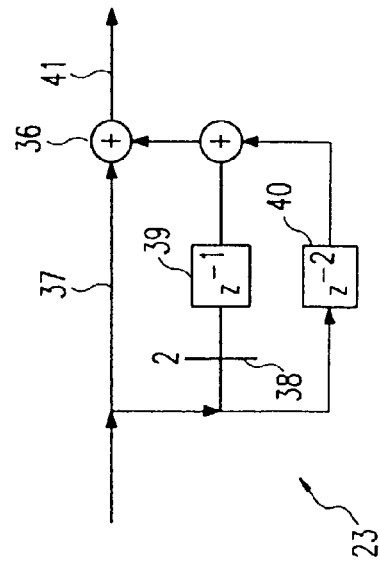
FIG. 6 is a block diagram of the implementation of a digital comb filter of the order k=3 according to the invention.

Correspondingly, an implementation of a filter structure for a comb filter of order k=3 is shown in FIG. 6. Each of the n filter stages of the filter device contains such a filter structure. The transfer function $\overline{H}(z)$ of the filter structure is $\overline{H}(z)=(1+z^{-1})^2=1+2 \cdot z^{-1}+z^{-2}$.

To implement the filter structure, an adder 36 is provided which is supplied with a current data value 37, the data value 39 multiplied by 2, which belongs to the preceding sampling pulse, and the data value 40 belonging to a further preceding sampling pulse which precedes the preceding sampling pulse by one. A result 41 of the adder can then be supplied to the next filter stage following. Multiplication by 2 is usually produced by left shifting 38 the bit pattern of the data value so that no elaborate multiplier circuit is required for this.

We claim:

1. A digital filter device for increasing a sampling rate and reconstructing signals of discrete-time input data, the digital filter device comprising:
n filter stages disposed in series and each having a filter stage input and a latch connected to said filter stage input, said latch doubling the sampling rate by outputting each input data value twice, each of said n filter stages having a filter structure disposed downstream of said latch and having a partial transfer function $\overline{H}(z)$ defined by $\overline{H}(z) \propto (1+z^{-1})^{k-1}$; and a transfer function H(z) of the digital filter device being $$H(z) \propto \left( \frac{1 - z^{-(2^n)}}{1 - z^{-1}} \right)^k,$$

where k is an order of the digital filter device and $2^n$ is a factor of an increase in the sampling rate and $z^{-1}$ is a z transform of a delay by one sampling pulse.

2. The digital filter device according to claim 1, wherein the digital filter device is a second-order digital filter device, said filter structure containing an adder with an output, a value at said output is formed by adding a data value currently present at said filter structure and a data value belonging to a preceding sampling pulse.

3. The digital filter device according to claim 1, wherein the digital filter device is a third-order digital filter device, said filter structure containing an adder with an output, a value at said output is formed by adding the following data values:
a first data value currently present at said filter structure;
a second data value multiplied by 2, which belongs to a preceding sampling pulse; and
a third data value belonging to a further preceding sampling pulse that precedes the preceding sampling pulse by one.

4. The digital filter device according to claim 3, wherein the second data value belonging to the preceding sampling pulse is multiplied by 2 by left-shifting a bit pattern.

5. The digital filter device according to claim 1, wherein the transfer function H(z) of the digital filter device is $$H(z) = \frac{1}{2^{nk}} \left( \frac{1 - z^{-(2^n)}}{1 - z^{-1}} \right)^k,$$

where k is the order of the filter device and $2^n$ is the factor of the increase in the sampling rate and $z^{-1}$ is the z transform of the delay by one sampling pulse.

6. The digital filter device according to claim 5, wherein the transfer function H(z) is normalized by a suitable number of right shifts of bit patterns of data values.

7. The digital filter device according to claim 1, wherein:
each of said n filter stages has an input databus, said input databus of a j-th filter stage of said n filter stages (where j=1, . . . , n) has a width of at least WL+(j−1)·(k−1)

data lines, where k is the order of the filter device and WL is a word length at an input of a first filter stage of said n filter stages;
each of said n filter stages has an internal databus connecting said latch to said filter structure, and said internal databus of said j-th filter stage has a width of at least WL+(j−1)·(k−1)

data lines; and
each of said n-filter stages has an output bus and said output bus of said j-th filter stage has a width of at least WL+j·(k−1)

data lines.

8. A method for increasing a sampling rate and reconstructing a signal of discrete-time input data, which comprises repeating the following steps n-times:
doubling the sampling rate by outputting each input data value twice; and
digitally filtering data values with a filter structure having a partial transfer function $\overline{H}(z)$ being $\overline{H}(z) \propto (1+z^{-1})^{k-1}$ where $z^{-1}$ is a z transform of a delay by one sampling pulse and k is an order of an entire digital filter device.

9. The method according to claim 8, which comprises setting a transfer function H(z) of the entire digital filter device to be $$H(z) \propto \left( \frac{1 - z^{-(2^n)}}{1 - z^{-1}} \right)^k$$

where k is the order of the entire digital filter device and $2^n$ is the factor of the increase in the sampling rate and $z^{-1}$ is the z transform of a delay by one sampling pulse.

10. The method according to claim 8, which comprises using a second-order digital filter device, the step of digitally filtering the data values is effected by adding a data value currently present at the filter structure and a data value belonging to a preceding sampling pulse.

11. The method according to claim 8, which comprises using a third-order digital filter device, the step of digitally filtering the data values is effected by adding the following data values:
a first data value currently present at the filter structure;
a second data value multiplied by 2, which belongs to a preceding sampling pulse; and
a third data value belonging to a further preceding sampling pulse preceding the preceding sampling pulse by 1.

12. The method according to claim 11, which comprises multiplying the second data value belonging to the preceding sampling pulse by 2 by left shifting a bit pattern.

* * * * *